United States Patent [19]
Ushiki et al.

[11] Patent Number: 5,181,646
[45] Date of Patent: Jan. 26, 1993

[54] LEAD FRAME HOLDING APPARATUS FOR USE IN WIRE BONDERS

[75] Inventors: Hiroshi Ushiki, Saitama; Noboru Fujino, Tokyo, both of Japan

[73] Assignee: Kabushiki Kaisha Shinkawa, Tokyo, Japan

[21] Appl. No.: 836,993

[22] Filed: Feb. 14, 1992

[30] Foreign Application Priority Data

Feb. 15, 1991 [JP] Japan .................... 3-42359

[51] Int. Cl.$^5$ ............................. B23K 37/00
[52] U.S. Cl. .................. 228/4.5; 219/56.21; 228/47
[58] Field of Search ........ 228/4.5, 47, 179, 8, 228/12, 7; 219/56.1, 56.22, 56.21

[56] References Cited

U.S. PATENT DOCUMENTS

| | | |
|---|---|---|
| 4,550,871 | 11/1985 | Chan et al. ................ 228/4.5 |
| 4,575,602 | 3/1986 | Sakurai .................... 228/4.5 |
| 4,789,095 | 12/1988 | Kobayashi ................. 228/4.5 |

FOREIGN PATENT DOCUMENTS

| | | |
|---|---|---|
| 0096648 | 7/1980 | Japan ..................... 228/4.5 |
| 0195945 | 10/1985 | Japan ..................... 228/4.5 |

*Primary Examiner*—Richard K. Seidel
*Assistant Examiner*—James Miner
*Attorney, Agent, or Firm*—Koda and Androlia

[57] ABSTRACT

A lead frame holding apparatus for wire bonding machines forcing an upward movement of a heater block and a frame retainer by a heater block raising-and-lowering cam and a frame retainer raising-and-lowering cam and a downward movement of the heater block and frame retainer via a spring force. When the heater block is raised and approaches its upper limit position, the frame retainer is raised by this upward motion of the heater block, thus positioning the lead frame at a standard bonding level.

2 Claims, 4 Drawing Sheets

LEAD FRAME HOLDING APPARATUS FOR USE IN WIRE BONDERS

BACKGROUND OF THE INVENTION

1. Field of the Invention

The present invention relates to a frame holding apparatus for use in wire bonders and more particularly to a bonding level adjustment mechanism in wire bonders.

2. Prior Art

In wire bonders, a wire passes through a bonding tool which is at the end of bonding arm. The bonding tool is moved in the X and Y horizontal directions and in the Z vertical direction so that the wire is connected to a first bonding point and a second bonding point of a workpiece.

Structures for moving the bonding tool in a vertical direction include a bonding arm which is rotated about its supporting shaft without any vertical movement of the supporting shaft. This technique is disclosed in the Japanese Patent Application Publication ("Kokoku") No. 63-52778. In this prior art, the bonding tool is raised and lowered when the bonding arm is rotated. Accordingly, depending upon the height of the bonding point level (hereafter called "bonding level"), the bonding tool is caused to tilt, thus causing some problems.

Generally, at the first bonding point, a ball is formed at the end of the wire that passes through the bonding tool and the bonding is performed using the ball. Thus, since there is a ball at the tip of the bonding tool, the ball can more or less absorb the bonding level discrepancies, if any. As a result, on the first bonding point side, a difference caused by the discrepancies will not create serious problems, and favorable bonding is accomplished.

However, at the second bonding point, only the wire is present; in other words, there is no ball on the second bonding point. Accordingly, when bonding is performed by pressing the wire 3 with the bonding tool 2, the axial line 6 of the bonding tool 2 can incline with respect to a predetermined perpendicular line 5 depending on the height of the bonding level 4 as shown in FIGS. 8(a) and 8(b). FIG. 8(a) and FIG. 7(a) show the bonding level 4 too high and therefore the bonding tool 2 is inclined to the right. FIG. 8(b) and FIG. 7(b) illustrate the bonding level 4 too low and therefore the bonding tool 2 is inclined to the left.

If the bonding level 4 is thus out of adjustment (too high or too low), the thickness dimension T of the press-bonded wire 3 cannot be consistent, and this causes a considerable variation in the strength of bonding. Furthermore, when the wire 3 is pulled and cut off after the bonding to the second bonding point is completed, such a cutting of the wire tends to occur at the weakest point of the wire where the T dimension of the wire is the smallest. This causes variations in the size of the press-bonded area. Accordingly, it is necessary to minimize the variation in the T dimension in order to obtain the best possible bonding result.

Adjustment of the height of the bonding level 4 can be accomplished by controlling the upward movement limit position of the heater block that supports the workpiece. One example of a frame holding apparatus with an adjustable upper limit position of the heater block is described in the Japanese Utility Model Application Publication (Kokoku) No. 2-9556.

In this prior art, a rod which is fastened to the undersurface of the heater block is moved up and down by a spring which urges the rod upward. The up and down motions of the rod is accomplished by a heater block raising-and-lowering cam which is set as a lift (the amount of up and down motions) which makes it possible to move the heater block by a predetermined extra stroke. The upper limit position of the heater block is controlled by an engagement part of the rod which comes into contact with a stopper that is screwed to a fixed part of the apparatus.

Thus, in this prior art, the bonding level is altered by changing the position of the stopper. Accordingly, there is no standard guide for the bonding level and also there is no reproducibility. In addition, the adjustment work requires special skill and a considerable amount of time.

SUMMARY OF THE INVENTION

The object of the present invention is to provide a frame holding apparatus used in wire bonders which makes it possible to adjust the bonding level with high precision and superior reproducibility by means of a process which requires no skill and takes shorter time.

The object is accomplished by an apparatus of a unique structure that includes:
- guide rails which support a lead frame thereon,
- a heater block which is raised and lowered beneath the lead frame,
- a frame retainer which is movable up and down above the lead frame,
- a heater block raising-and-lowering cam (called "heater block cam") and a frame retainer raising-and-lowering cam (called "frame retainer cam") which respectively raises and lowers the heater block and frame retainer,
- spring means urging the heater block and the frame retainer so that the heater block and frame retainer are moved up and down by the heater block cam and frame retainer cam, and
- a motor which rotates the heater block cam and the frame retainer cam.

The holding apparatus thus structured is featured in that:

(1) the upward movement of the heater block and frame retainer is accomplished forcibly by the heater block cam and frame retainer cam, (2) the downward movement of the heater block and frame retainer is accomplished by the spring means, and (3) when the heater block is moved to its upper limit position, the frame retainer is raised by the upward motion of the heater block.

The object of the present invention is also accomplished by using an apparatus of substantially the same structure as the one described above. More specifically, in the second embodiment of the present invention:

(1) the downward movement of the heater block and frame retainer is accomplished forcibly by the heater block cam and frame retainer cam, (2) the upward movement of the heater block and frame retainer is accomplished by the spring means, and (3) when the heater block is moved to its lower limit position, the frame retainer is lowered by the downward motion of the heater block.

In the first apparatus, both the heater block and the frame retainer are forcibly moved upward by the corresponding cams, i.e., the heater block cam and the frame retainer cam. Thus, the lead frame can be moved up and down by the heater block lowering cam. In other words, the bonding level is determined by the upper limit position of the heater block. Accordingly, it is only necessary to input beforehand a value of the driving amount of the motor (a bonding level setting value) that brings the heater block to its upper limit position, into a control circuit for the motor. Thus, by first positioning the frame retainer slightly below the bonding level via the motor and then raising the heater block to its upper limit position via the motor, the frame retainer can be raised through the lead frame, and the lead frame is positioned at the bonding level.

In the second apparatus, both the heater block and the frame retainer are forcibly moved downward by the corresponding cams, i.e., the heater block cam and the frame retainer cam. As a result, the lead frame can be moved up and down by the frame retainer cam. In other words, the bonding level is determined by the lower limit position of the frame retainer. Accordingly, it is only necessary to input beforehand a value of the driving amount of the motor (a bonding level setting value) that brings the lead frame retainer to its lower limit position, into a control circuit for the motor. Thus, by first positioning the heater block slightly above the bonding level via the motor and then lowering the frame retainer to its lower limit position via the motor, the heater block can be lowered through the lead frame, and the lead frame is positioned at the bonding level.

DETAILED DESCRIPTION OF THE INVENTION

One embodiment of the present invention will be described below with reference to FIGS. 1, 2 and 3.

Figure 1:
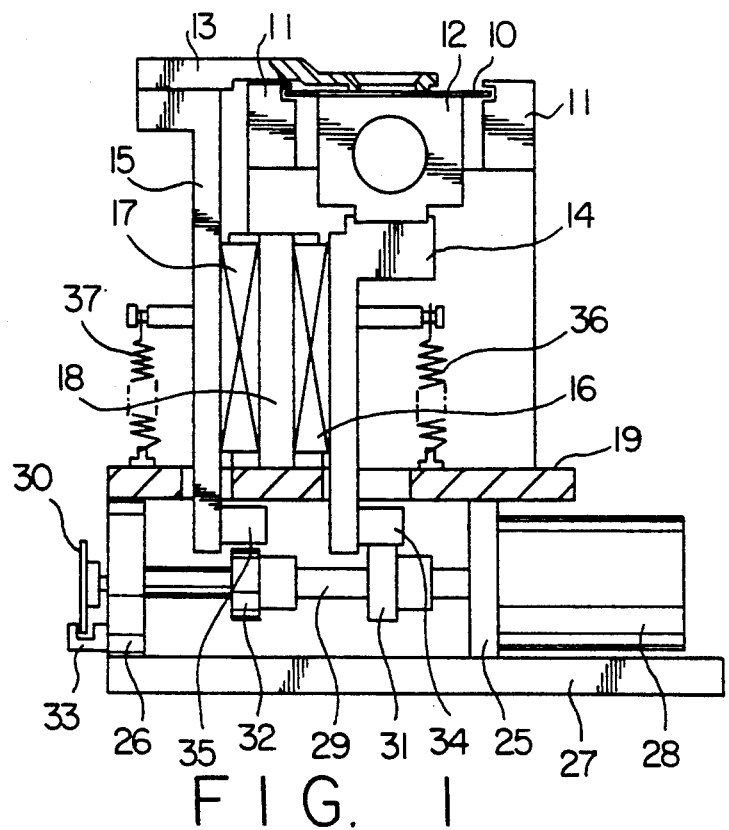
FIG. 1 is a front view of a frame holding apparatus for use in wire bonders according to the present invention.

As shown in FIG. 1, a heater block 12 is installed between guide rails 11 which support a lead frame 10. A frame retainer 13 which presses the lead frame 10 against the heater block 12 is installed above the heater block 12 which is in a bonding station. The heater block 12 and frame retainer 13 are mounted to respective holders 14 and 15. These holders 14 and 15 are mounted to respective guides 16 and 17 which have vertical guide grooves so that the holders 14 and 15 can move up and down. The guides 16 and 17 are attached to a stand 18, which is fixed on a supporting plate 19.

The supporting plate 19 is provided on a base plate 27 via legs 25 and 26. A motor 28, that can make both forward and reverse rotations and is pulse-driven, is mounted to the leg 25. A cam shaft 29 is attached to the output shaft of this motor 28. The motor 28 is driven via a driving circuit by signals supplied from a control circuit (not shown).

A starting-point cam 30, a heater block raising-and-lowering cam (called "heater block cam") 31 and a frame retainer raising-and-lowering cam (called "frame retainer cam") 32 are mounted on the cam shaft 29. A sensor 33 which detects the position of the starting point is provided on the leg 26 in a manner so as to face the starting-point cam 30. Rollers 34 and 35 are rotatably provided on the holders 14 and 15, respectively, so as to come into contact with the heater block cam 31 and frame retainer cam 32. The holders 14 and 15 are urged downwardly by respective springs 36 and 37 so that the rollers 34 and 35 are pressed onto the heater block cam 31 and frame retainer cam 32.

Figure 2:
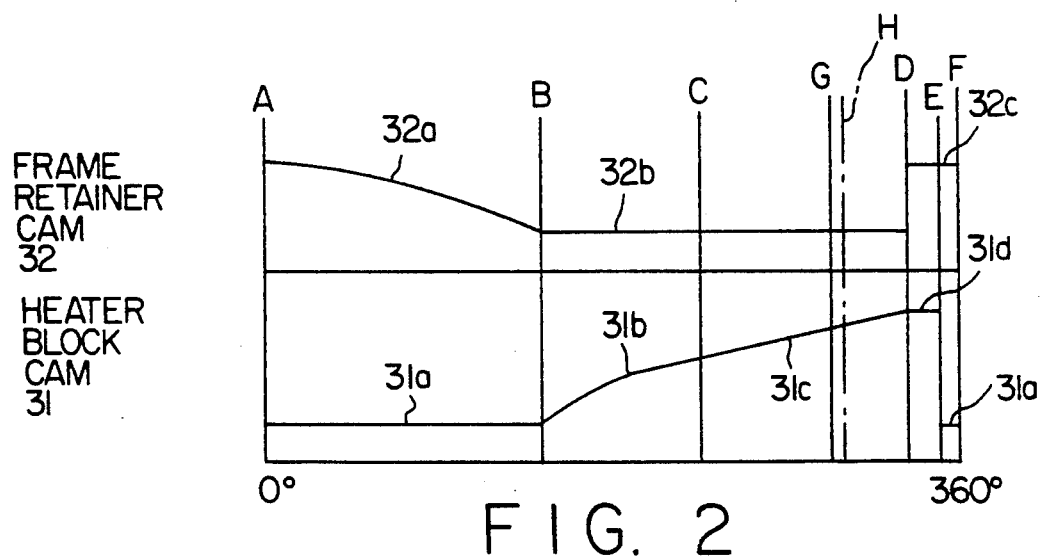
FIG. 2 shows movements of the heater block raising-and-lowering cam and frame retainer raising-and-lowering cam used in the apparatus.

FIG. 2 shows an expansion plan showing the shapes of the heater block cam 31 and frame retainer cam 32.

More specifically, from point A to B, the heater block cam 31 has a constant-radius section 31a with a fixed radius. From B to C, the cam 31 has a sine-rise section 31b which rises in the form of a sine curve, and from C to D, the cam 31 has a linear-rise section 31c which rises linearly. From D to E, the cam 31 has a constant-radius section 31d with a fixed radius, and from E to F, the cam 31 has a constant-radius section 31a with the same radius as the constant-radius section 31a.

On the other hand, the frame retainer cam 32 has a cosine-drop section 32a from A to B which drops in the form of a cosine curve. From B through D, the cam 32 has a constant-radius section 32b with a fixed radius, and from D to F, the cam 32 has a constant-radius section 32c with a fixed radius which has the same radius as the point A.

Figure 3A:
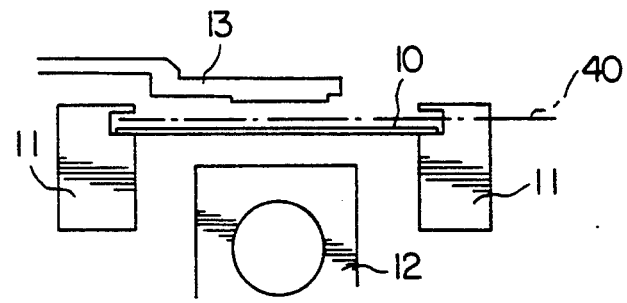
FIGS. 3(a), 3(b) and 3(c) are explanatory diagrams that show a setting of bonding levels.

With these cam shapes, when the heater block cam 31 and frame retainer cam 32 are at point A which is the starting point, the heater block 12 and frame retainer 13 are positioned as shown in FIG. 3(a). The motor 28 is driven for the length equal to a set-pulse, which is pre-set and inputted in a control circuit (not shown) by an operator through an operation panel, so that the heater block cam 31 and frame retainer cam 32 are rotated in the forward direction and then rotated in the reverse direction, thus returning to the starting point A.

Figure 3B:
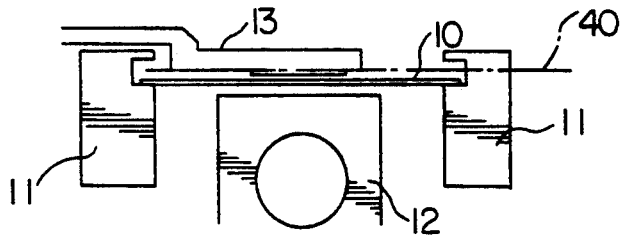

The pulse setting is made in advance so that when the rollers 34 and 35 are at point C, the heater block 12 is positioned slightly below the undersurface of the lead frame 10, and the frame retainer 13 is positioned slightly below the standard bonding level 40 which is set in the apparatus. These positions are shown in FIG. 3(b). In addition, a standard set value of the standard point G of the heater block cam 31 is inputted beforehand in the control circuit. The standard set value brings the upper surface of the lead frame 10 to the standard bonding level 40, and it is where the roller 34 is located on the standard point G of the heater block cam 31 when the lead frame 10 is pushed upward by the heater block 12.

In operation, prior to the initiation of the bonding operation, the bonding level is set first. After the lead frame 10 that is to be bonded has been fed to the bonding station (as shown in FIG. 3(a)), the motor 28 is started, and the heater block cam 31 and frame retainer cam 32 are rotated so that the rollers 34 and 35 are positioned at point G. In other words, as a result of the starting of the motor 28, the heater block cam 31 and frame retainer 32 are rotated via the cam shaft 29.

First, when the frame retainer cam 32 rotates from point A to point C, the roller 35 descends due to the cosine-drop section 32a of the frame retainer cam 32. Accordingly, the frame retainer 13 is lowered via the holder 15, and positioned as shown in FIG. 3(b). On the other hand, the roller 34 ascends by the sine-rise section 31b of the heater block cam 31; thus, the heater block 12 is raised via the holder 14 and positioned as shown in FIG. 3(b).

Figure 3C:
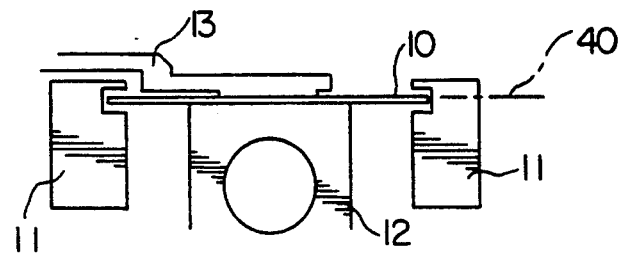

Next, as a result of the rotation of the heater block cam 31 from point C to point G, the heater block 12 is raised as shown in FIG. 3(c), the lead frame 10 is pushed upward by the heater block 12, and the upper surface of the lead frame 10 is positioned at the standard bonding level 40. When the heater block 12 is raised as shown in FIG. 3(c), the frame retainer 13, overcoming the spring force of the spring 37, is pushed upwardly by the lead frame 10. In other words, the lead frame 10 is pressed against the heater block 12 by the frame retainer 10.

Next, keys on operating panel (not shown) are operated so that the bonding tool 2 is lowered to come into contact with the lead frame 10. Then, the inclination of the bonding tool 2 in this state is checked. If the bonding tool 2 is inclined, a digital switch on the operating panel is operated so that the motor 28 is driven slightly in the forward and reverse directions, thus rotating the heater block cam 31 and frame retainer cam 32. As a result, the heater block 12 is raised and lowered the distance that corresponds to the input pulse which has been inputted. Then, a set value representing the bonding tool 2 adjusted to be perpendicular is stored in the control circuit at a bonding level set value.

The above-described setting action of the bonding level needs to be performed only once. More specifically, if the thickness of the lead frame changes as a result of a different type of product being handled, it is only necessary to input a set value of the bonding level corresponding to the thickness of the new lead frames into the control circuit. If the lead frames have been set previously, it is only necessary to input the set value of such lead frames. Accordingly, the bonding level can be set with high precision and superior reproducibility by an operation which requires no special skill, taking a very short time.

After the setting of the bonding level of the lead frame 10 is completed as described above, the heater block cam 31 and frame retainer cam 32 in the following bonding operation are rotated from point A to point H, which corresponds to the set value of the bonding level and then stopped. After the bonding to the lead frame 10 is completed, the motor 28 is driven in the reverse direction, so that the cams 31 and 32 return to point A from point H.

Thus, in the present invention, the upward action of the heater block 12 and frame retainer 13 is accomplished forcibly by means of heater block cam 31 and frame retainer lowering cam 32, respectively, while the downward action of the heater block 12 and frame retainer 13 is accomplished by means of the springs 36 and 37. In addition, the bonding level is set by setting the upper limit position of the heater block 12, and when the heater block 12 reaches its upper limit position, the frame retainer 13 is pushed upwardly by the upward motion of the heater block 12 with the lead frame 10 in between.

Figure 4:
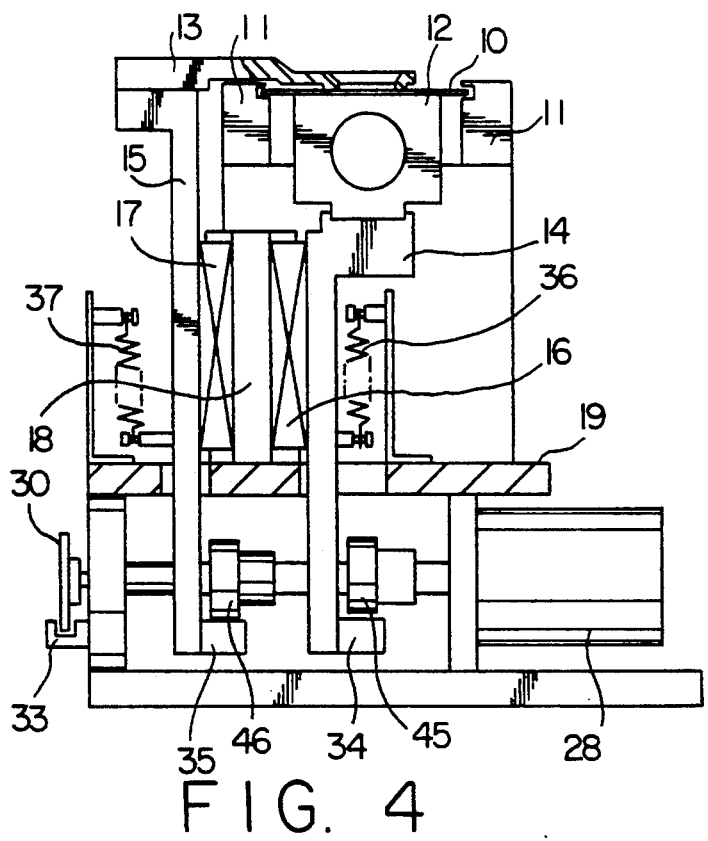
FIG. 4 is a front view of the frame holding apparatus in another embodiment according to the present invention.
Figure 5:
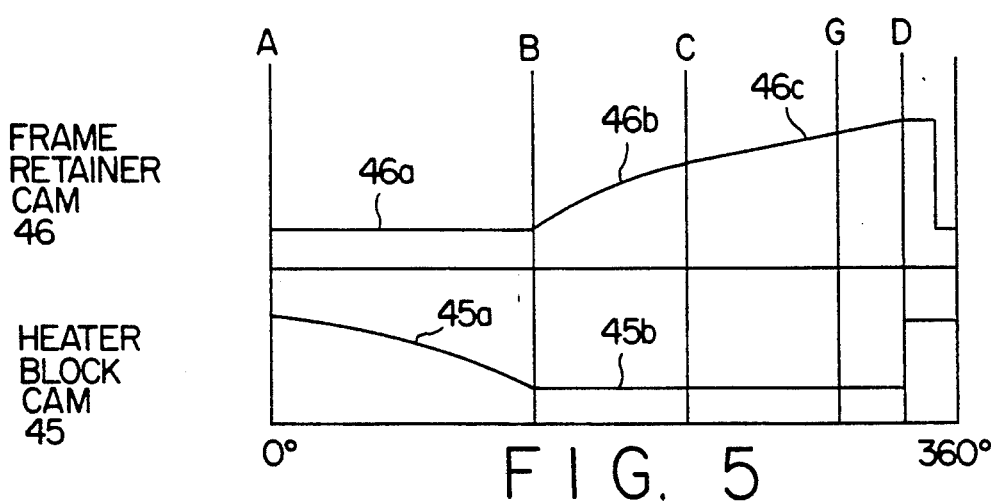
FIG. 5 shows the movements of the heater block raising-and-lowering cam and frame retainer raising-and-lowering cam in the apparatus shown in FIG. 4.
Figure 6A:
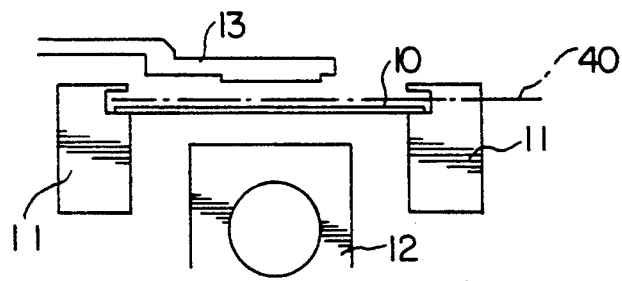
FIGS. 6(a), 6(b) and 6(c) are explanatory diagrams showing the setting of bonding levels utilized in the apparatus shown in FIG. 4.
Figure 6B:
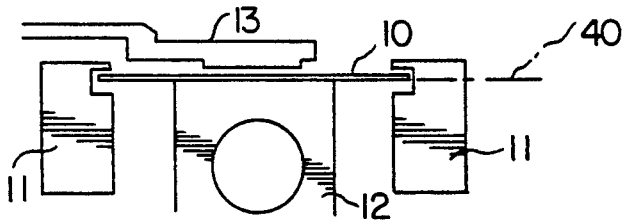
Figure 6C:
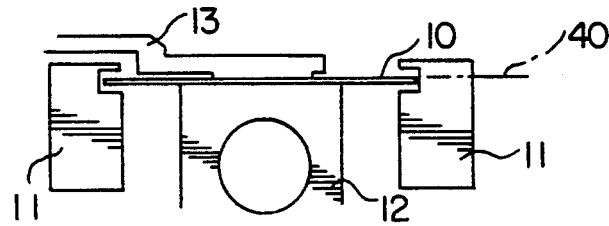
Figure 7A:
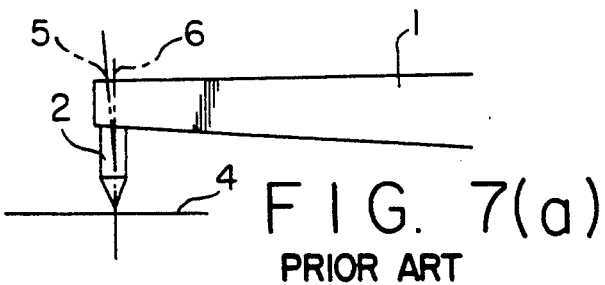
FIGS. 7(a) and 7(b) are explanatory diagrams which illustrate inclined states of the bonding tool used in the apparatus of the present invention.
Figure 7B:
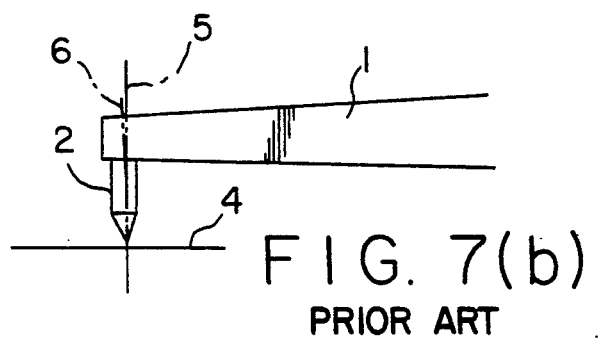
Figure 8A:
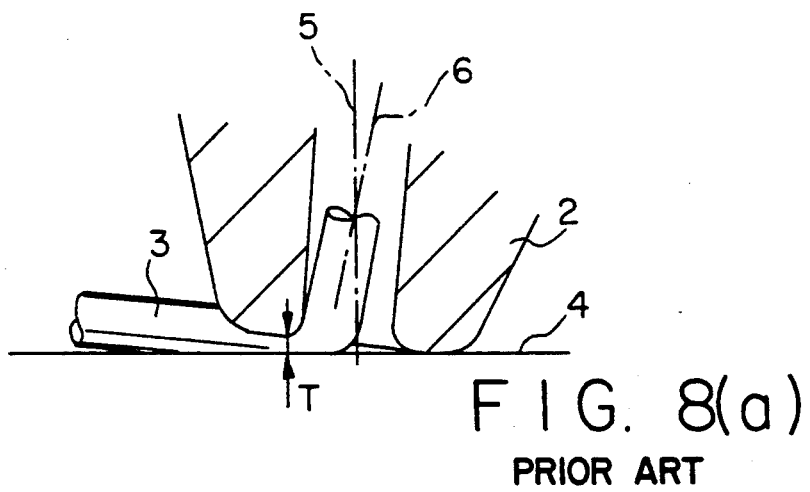
FIG. 8(a) is an enlarged view of an essential portion of the bonding tool shown in FIG. 7(a)
Figure 8B:
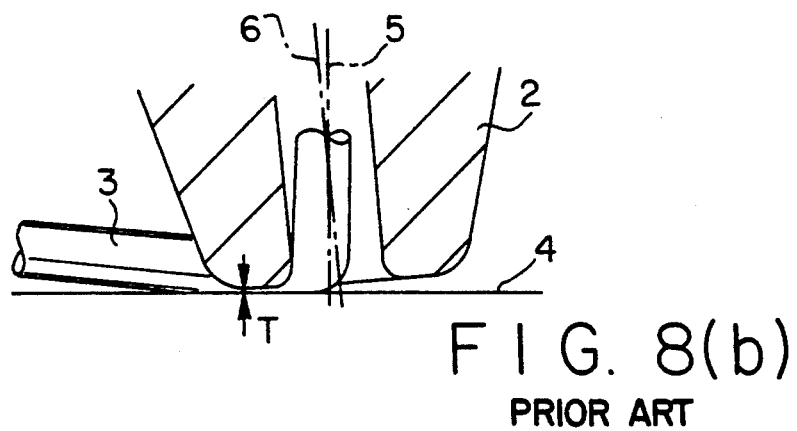
FIG. 8(b) is an enlarged view of an essential portion of the bonding tool shown in FIG. 7(b).

FIGS. 4, 5 and 6 illustrate another embodiment of the present invention. This embodiment is exactly opposite to the above-described embodiment. More specifically, the downward action of the heater block 12 and frame retainer 13 is accomplished forcibly by heater block cam 45 and frame retainer cam 46, and the upward action of the heater block 12 and frame retainer 13 is accomplished by the spring means 36 and 37, respectively. Accordingly, the bonding level is determined by setting the lower limit position of the frame retainer 13, so that when the frame retainer 13 moves to its lower limit position, the heater block 12 is lowered by the lowering action of the lead frame 13 with the lead frame 10 in between.

More specifically, as shown in FIG. 4, the holders 14 and 15 fixed to the heater block 12 and frame retainer 13, respectively, are urged upwardly by the springs 36 and 37 so that the rollers 34 and 35 are pressed against the heater block cam 45 and frame retainer cam 46. As shown in FIG. 5, the heater block cam 45 and the frame retainer cam 46 are shaped so that the heater block cam 31 in the previous embodiment is the same as the frame retainer cam 46 of the present embodiment, and the frame retainer cam 32 in the previous embodiment is the same as the heater block cam 45 of the present embodiment.

With the structure above, when the motor 28 is started at the state illustrated in FIG. 6(a) and the heater block cam 45 and frame retainer cam 46 rotate from starting point A to point B, the heater block 12 ascends due to the cosine-drop section 45a of the heater block cam 45. Accordingly, the lead frame 10 is positioned slightly above the standard bonding level 40 as shown in FIG. 6(b). In other words, the amount of lift provided by the cosine-drop section 45a is such that the lead frame 10 is raised to a point slightly above the standard bonding level 40.

When the heater block cam 45 and frame retainer cam 46 are rotated from point B to point G, the frame retainer 13 approaches the lead frame 10 from above as shown in FIG. 6(b) by the sine-rise section 46b of the frame retainer cam 46, and then the frame retainer 13 is further lowered by the linear rise section 46c. As a result of this downward movement, the frame retainer 13 pushes down the heater block 12 with the lead frame 10 in between, so that the lead frame 10 is positioned at the standard bonding level 40. Thus, this embodiment has the same effect as the first embodiment.

In the present invention, either the upper limit or lower limit position of the heater block or frame retainer is controlled by cams which are driven by a motor. Accordingly, the bonding level can be set with high precision and superior reproducibility by an operation which requires no special skill in a short period of time.

We claim:

1. A frame holding apparatus for use in wire bonders, said holding apparatus comprising (a) guide rails which support a lead frame, (b) a heater block installed so as to be under said lead frame and movable in a vertical direction, (c) a frame retainer installed so as to be above said lead frame and movable in a vertical direction, (d) a heater block raising-and-lowering cam and a frame retainer raising-and-lowering cam which respectively raises and lowers said heater block and frame retainer, (e) spring means installed so as to urge said heater block and frame retainer to move up and down via said heater block raising-and-lowering cam and frame retainer raising-and-lowering cam, and (f) a motor which rotates said heater block raising-and lowering cam and frame retainer raising-and-lowering cam, and said holding apparatus being characterized in that upward movement of said heater block and frame retainer is accomplished forcibly by said heater block raising-and-lowering cam and frame retainer raising-and-lowering cam, a downward movement of said heater block and frame retainer is accomplished by said spring means, and when said heater block is moved to its upper limit position, said frame retainer is raised by an upward motion of said heater block.

2. A frame holding apparatus for use in wire bonders, said holding apparatus comprising (a) guide rails which support a lead frame, (b) a heater block installed so as to be under said lead frame and movable in a vertical direction, (c) a frame retainer installed so as to be above said lead frame and movable in a vertical direction, (d) a heater block raising-and-lowering cam and a frame retainer raising-and-lowering cam which respectively raises and lowers said heater block and frame retainer, (e) spring means installed so as to urge said heater block and frame retainer to move up and down via said heater block raising-and-lowering cam and frame retainer raising-and-lowering cam, and (f) a motor which rotates said heater block raising-and-lowering cam and frame retainer raising-and-lowering cam, and said holding apparatus being characterized in that (1) a downward movement of said heater block and frame retainer is accomplished forcibly by said heater block raising-and-lowering cam and frame retainer raising-and-lowering cam, (2) an upward movement of said heater block and frame retainer is accomplished by said spring means, and (3) when said frame retainer is moved to its lower limit position, said heater block is lowered by a downward motion of said frame retainer.

* * * * *